United States Patent
Lu et al.

(10) Patent No.: US 7,521,113 B2
(45) Date of Patent: *Apr. 21, 2009

(54) LIGHT-EMITTING DEVICES WITH FULLERENE LAYER

(76) Inventors: Zheng-Hong Lu, 556 Davisville Avenue, Toronto (CA) M4S 1J5; Xiaodong Feng, 12 Hickory Street, Toronto (CA) M5T 2P1

( * ) Notice: Subject to any disclaimer, the term of this patent is extended or adjusted under 35 U.S.C. 154(b) by 209 days.

This patent is subject to a terminal disclaimer.

(21) Appl. No.: 10/811,153

(22) Filed: Mar. 29, 2004

(65) Prior Publication Data
US 2004/0214041 A1 Oct. 28, 2004

Related U.S. Application Data

(60) Provisional application No. 60/465,793, filed on Apr. 28, 2003.

(51) Int. Cl.
*B32B 27/00* (2006.01)
*H01L 29/225* (2006.01)
*H01L 33/00* (2006.01)

(52) U.S. Cl. .................. 428/212; 428/408; 428/690; 428/326; 428/332; 428/917; 423/447.1; 423/447.2; 438/22; 438/23; 438/34; 438/48; 438/79; 313/506; 257/79

(58) Field of Classification Search .......... 428/690, 428/328, 332, 917, 212, 408; 313/506; 423/447.1, 423/447.2; 257/79; 438/22, 23, 24, 48
See application file for complete search history.

(56) References Cited

U.S. PATENT DOCUMENTS

| | | | |
|---|---|---|---|
| 4,356,429 A | 10/1982 | Tang | |
| 5,171,373 A | 12/1992 | Hebard et al. | |
| 5,420,746 A * | 5/1995 | Smith | 361/311 |
| 5,759,725 A | 6/1998 | Hirao et al. | |
| 5,776,622 A | 7/1998 | Hung et al. | |
| 5,861,219 A | 1/1999 | Thompson et al. | |
| 6,069,442 A * | 5/2000 | Hung et al. | 313/504 |

(Continued)

FOREIGN PATENT DOCUMENTS

EP 1 017 118 7/2000

(Continued)

OTHER PUBLICATIONS

Metal/AIQ₃ Interface Structures, Turak et al., Applied Physics Letters, vol. 81, No. 4, Jul. 22, 2002, 766-768.

(Continued)

*Primary Examiner*—Jennifer McNeil
*Assistant Examiner*—Lawrence D Ferguson
(74) *Attorney, Agent, or Firm*—Hill & Schumacher; Lynn Schumacher

(57) ABSTRACT

The present invention provides a layered structure including a fullerene layer exhibiting Ohmic behavior. The layered device includes a layer of fullerenes and a layer of a fluoride compound of pre-selected thickness. The layered structure includes a third layer of an electrically conductive material located on the second layer to which electrical contact can be made. The thickness of the second layer is selected so that the layered structure exhibits substantially Ohmic contact across the first, second and third layers. The present invention also provides a light-emitting device which includes a substrate and a first electrically conductive layer defining an anode electrode layer on the substrate. The device includes an electron transport layer which includes fullerenes, and a second electrically conductive layer defining a cathode electrode layer on the electron transport layer. The device includes a layer of light-emissive material between the anode electrode layer and the electron transport layer.

27 Claims, 4 Drawing Sheets

U.S. PATENT DOCUMENTS

| | | | |
|---|---|---|---|
| 6,274,979 B1 * | 8/2001 | Celii et al. | 313/506 |
| 6,310,360 B1 | 10/2001 | Forrest et al. | |
| 6,486,601 B1 | 11/2002 | Sakai et al. | |
| 6,515,298 B2 | 2/2003 | Forrest et al. | |
| 6,833,201 B2 * | 12/2004 | Czerw et al. | 428/690 |
| 2001/0046612 A1 | 11/2001 | Lee et al. | |
| 2002/0093006 A1 | 7/2002 | Vardeny et al. | |
| 2003/0042846 A1 | 3/2003 | Forrest et al. | |

FOREIGN PATENT DOCUMENTS

| | | |
|---|---|---|
| EP | 1 434 469 | 6/2004 |
| JP | 04-144479 | 5/1992 |
| JP | 5331458 | 12/1993 |
| JP | 11-191490 | 1/1999 |
| JP | 2000-196140 | 7/2000 |
| JP | 2001-006878 | 1/2001 |
| JP | 2001-220380 | 8/2001 |
| JP | 2002-175888 | 6/2002 |
| JP | 2002-289358 | 10/2002 |
| JP | 2003-082341 | 3/2003 |
| WO | WO 02 058110 A2 | 7/2002 |
| WO | WO 02/058110 A2 | 7/2002 |
| WO | WO 02/058110 A3 | 7/2002 |
| WO | WO 03/017730 | 2/2003 |

OTHER PUBLICATIONS

Organic Light-Emitting diodes with a Nanostructured Fullerene Layer at the Interface between $Alq_3$ and TPD Layers, Kato et al., Jpn. J. Appl. Phys. vol. 42 (2003) pp 2526-2529, Part 1. No. 4B, Apr. 2003.

"Metal/$AlQ_3$ Interface Structures", Turak et al. Applied Physics Letters, Jul. 22, 2002, vol. 81(4), pp. 766-768.

"Organic Light-Emitting Diodes with a Nanostructured Fullerene Layer at the Interface between $Alq_3$ an TPD Layers", Kato et al.; Jpn. J. Appl Phys, Apr. 2003, vol. 42(2003), pp. 2526-2529.

* cited by examiner

LIGHT-EMITTING DEVICES WITH FULLERENE LAYER

CROSS REFERENCE TO RELATED U.S. APPLICATION

This patent application relates to, and claims the priority benefit from, U.S. Provisional Patent Application Ser. No. 60/465,793 filed on Apr. 28, 2003, which is incorporated herein by reference in its entirety.

FIELD OF THE INVENTION

The present invention relates to organic-based light-emitting devices (OLEDs) and more particularly the present invention relates to hybrid electroluminescence devices in which a fullerene layer is used as the electron transport layer, replacing the problematic organic electron transport layer currently used in OLEDs. The present invention also relates to the use of interfacial contact layers for making Ohmic contact to the fullerene layer.

BACKGROUND OF THE INVENTION

A typical organic light-emitting device includes an anode, an active light-emitting zone comprising one or more electroluminescent organic material(s), and a cathode. One of the electrodes is optically transmissive while the other one is optically reflective. The function of the anode is to inject positively charged particles referred to as holes into the light-emitting zone, and that of the cathode is to inject electron into the emission zone. A process involved in the recombination of the electron and the hole leads to the creation of light wave. The light wave is escaped through one of the aforementioned electrodes.

U.S. Pat. No. 4,356,429 discloses inserting a hole-transport organic layer between the anode and the emission zone, and an electron-transport organic layer between the cathode and the emission zone.

It is well documented that many different types of organic molecules provide an excellent medium for the transport of holes but unfortunately they are very poor in regard to the transport of electrons. It is critical to have balance electron and hole density in the emission zone to obtain optimal device performance. In order to enhance the electron injection, low work function metals such as Ca and Mg, which provide excellent energy band-matching to that of the lowest unoccupied molecular orbital (LUMO), have been selected as cathode materials. However, the low work function metals are highly reactive that leads to fragmentation of the organic molecules when vapour phase metal atoms strike on the organic film surface [A. Turak, D. Grozea, X. D. Feng, Z. H. Lu, H. Aziz, and A. M. Hor, "Metal/Alq Interface Structures", Appl. Phys. Lett. 81, 766 (2002).]. This limits the ability to use low work function metals as cathode. In general the cathode interface stability suffers from the fact that organic and polymeric materials contain more than one element which are very reactive. Some elements such as oxygen readily react with elements making up the cathode to form interfacial oxides, which results in electrical degradation [A. Turak, D. Grozea, X. D. Feng, Z. H. Lu, H. Aziz, and A. M. Hor, "Metal/Alq Interface Structures", Appl. Phys. Lett. 81, 766 (2002)].

As a family member of naturally occurring allotropes of carbon, fullerene materials are known for their robust structures and superior charge transport properties. U.S. Pat. No. 5,861,219 discloses the use of fullerenes as a dopant added to a host metal complex of 5-hydroxy-quinoxaline used in organic light emitting diodes. The host metal complex of 5-hydroxy-quinoxaline is contained in the electroluminescent layer which forms the emission zone in the structure. United States Patent Publication US 2002/0093006 A1 discloses the use of a fullerene layer as the light emissive layer in an organic light emitting diode structure.

United States Patent Publication US 2003/0042846 A1 discloses the use of a fullerene layer as an electron acceptor layer in organic photovoltaic devices.

Japan Patent 3227784 and Japanese patent application 04-144479 disclose the use of fullerenes as a hole transport layer.

U.S. Pat. No. 5,171,373 discloses the use of fullerenes in solar cells. U.S. Pat. No. 5,759,725 discloses the use of fullerenes in photoconductors.

The use of fullerenes as an interface layer between the hole transport layer and the light emission layer has been disclosed by Keizo Kato, Keisuke Suzuki, Kazunari Shinbo, Futao Kaneko, Nozomu Tsuboi, Satosh Kobayashi, Toyoyasu Tadokoro, and Shinichi Ohta, Jpn. J. Appl. Phys. Vol. 42, 2526 (2003).

U.S. Pat. No. 5,776,622 issued to Hung et al. discloses an electroluminescence device including an anode, cathode and EL layer, in which the cathode layer contacts the EL layer and includes a fluoride layer in direct contact with the EL layer and a conductive layer in direct contact with the fluoride layer.

The light output of a typical OLED involves two-coupled light waves, one propagates directly through of the light-transmissive electrode, and the other reflected back from the reflective electrode and then propagate through the light-transmissive electrode. These two light waves have approximately the same amplitude and the optical interference of these two light beams dictates the total amplitude and spectral profile of the final output light waves.

It would be very advantageous to provide an organic-based electroluminescence device which provides better electronic transport in the electronic transport layer and better transport across the electronic transport layer from the cathode electrode layer to the light emission zone.

SUMMARY OF THE INVENTION

It is the object of the present invention to provide an organic-based electroluminescence device in which a fullerene layer is used as the electron transport layer, replacing the current problematic organic molecule-based electron transport layer and it is another objective of this invention to provide an interfacial layer between the fullerene layer and a cathode electrode layer which makes Ohmic contact with the fullerene layer so that there is little or no potential barrier for electrons traveling across the fullerene/interfacial layer/metallic cathode region.

It is a further object of the present invention to provide a hybrid organic-based light-emitting device that permits optical tuning of the output spectral and power efficiency.

In one aspect of the invention there is provided a layered structure including a fullerene layer exhibiting Ohmic behavior. The layered device includes a first layer consisting essentially of fullerenes having a first surface and a second surface opposed to the first surface. The layered structure includes a second layer of pre-selected thickness comprising a fluoride compound located on the first surface of the first layer. The layered structure includes a third layer comprising an electrically conductive material located on the second layer. The pre-selected thickness of the second layer is selected so that the layered structure exhibits substantially Ohmic behavior across the first, second and third layers.

In another aspect of the present invention there is provided a layered structure including a fullerene layer exhibiting Ohmic behavior. The layered structure includes a first layer consisting essentially of fullerenes having a first surface and a second surface opposed to the first surface. The layered structure includes a second layer comprising a low work function material located on the first surface of the first layer consisting essentially of fullerenes. The layered structure includes a third layer comprising an electrically conductive material located on the second layer. The low work function material is chosen on the basis that the layered structure exhibits substantially Ohmic behavior across the first, second and third layers.

In another aspect of the invention there is provided a light-emitting device, comprising a substrate and a first electrically conductive layer forming an anode electrode layer on the substrate. The device includes a hole transport layer on said anode electrode layer, a layer of a light emissive material on said hole transport layer, an electron transport layer comprising fullerenes located on said layer of a light emissive material, and a second electrically conductive layer forming a cathode electrode layer on the electron transport layer. The device includes a layer comprising a light-emissive material internosed between the anode electrode layer and the electron transport layer.

In this aspect of the invention the hole transport layer may be comprised of organic molecules which conduct holes.

In this aspect of the invention the device may include an interfacial layer interposed between the layer consisting essentially of a fullerene and the electrically conductive layer defining a cathode electrode with the material of the interfacial layer being selected so that the interfacial layer makes Ohmic contact with the fullerene layer.

There may also be an a lithium fluoride (LiF) layer of thinckness from about 0.2 nm to about 3 nm located between the electron transport layer comprising fullerenes and the layer of light-emissive material.

There may also be an a interfacial layer interposed between the layer comprising a fullerene and the light-emissive layer made from a material which blocks holes whereby the hole blocking layer blocks or prevents holes from leaking into the fullerene layer.

In another aspect of the present invention there is provided a layered structure including a fullerene layer exhibiting Ohmic behavior, comprising:

a) a first layer consisting essentially of one of a mixture of fullerenes and inorganic materials, and polymeric fullerenes, said first layer having a first surface and a second surface opposed to the first surface;

b) a second layer of pre-selected thickness comprising a fluoride compound located on said first surface of said first layer; and c) a third layer comprising an electrically conductive material located on the second layer, the pre-selected thickness of the second layer being selected so that the layered structure exhibits substantially Ohmic behavior across the first, second and third layers.

In another aspect of the present invention there is provided a layered structure including a fullerene layer exhibiting Ohmic behavior, comprising:

a) a first layer consisting essentially of one of a mixture of fullerenes and inorganic materials, and polymeric fullerenes, said first layer having a first surface and a second surface opposed to the first surface;

b) a second layer comprising a low work function material located on said first surface of said first layer; and c) a third layer comprising an electrically conductive material located on the second layer, the low work function material being selected so that the layered structure exhibits substantially Ohmic behavior across the first, second and third layers.

BRIEF DESCRIPTION OF THE DRAWINGS

The layered structure and the light-emitting device produced according to the present invention will now be described, by way of example only, reference being made to the accompanying drawings, in which.

DETAILED DESCRIPTION OF THE INVENTION

Definitions

As used herein, the phrase "electron transport layer" means a thin-film material having a primary function of conducting or transporting electrons across the layer from one region to another region.

As used herein, the phrase "hole transport layer" means a thin-film material having a primary function to conduct holes across the layer from one region to another region.

As used herein, the phrase "light emissive layer or light-emission layer" means a thin-film material having the primary function of emitting light.

As used herein, the phrase "electroluminescence layer" means a thin-film material having a primary function of emitting light under electrical stimulation.

As used herein, the phrase "Ohmic contact (or Ohmic behavior)" means that electrical current increases linearly as a function of applied voltage across one (or more) contact interface(s) made between two (or more) different materials.

As used herein, the term "fullerene" means nanostructured carbon consisting of 60, 70, or more carbon atoms self-bonded in spherical forms which are also referred to as Buckminster fullerenes, nano bucky balls (NBB) or bucky balls (BB) in the literature. The carbon atoms may be bonded to additional atoms or functional groups.

As used herein, the phrase "hole injection layer (or hole injection electrode)" means a thin film layer having a primary function of facilitating hole injection into a hole transport layer and the hole injection layer is typically the anode.

As used herein, the phrase "interfacial contact layer", or "interfacial layer" means an ultra-thin layer inserted between two adjacent layers to serve as an interface transition layer.

Layered Structure Exhibiting Ohmic Behavior

Figure 1:
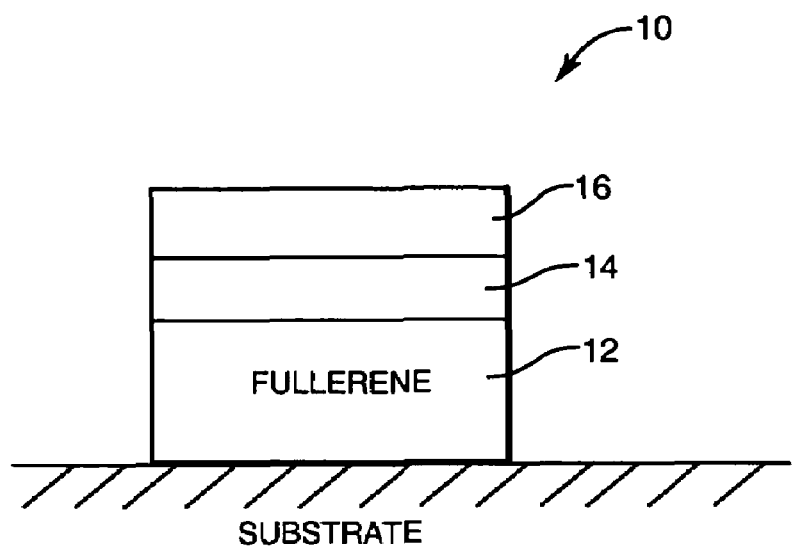
FIG. 1 is a sectional view of a layered structure exhibiting Ohmic behavior produced in accordance with the present invention.

Referring first to FIG. 1 there is shown a layered structure 10 including a fullerene layer exhibiting Ohmic behavior. The layered structure 10 includes a first layer 12 comprising fullerenes and a second layer 14 of pre-selected thickness comprising a fluoride compound located on a first surface of layer 12. A third layer 16 comprising an electrically conductive material is located on the second layer 14 to which electrical contact can be made, the pre-selected thickness of the fluoride compound being selected so that the layered structure exhibits substantially Ohmic behavior across the first, second and third layers.

The fullerene may be C60, C70 or combinations thereof. Layer 12 comprising fullerenes may also include a mixture of fullerenes and organic molecules, a mixture of fullerenes and inorganic materials, polymeric fullerenes, and fullerenes chemically bonded to conducting polymers.

The fluoride compound may be alkaline fluoride compound, and preferably the alkaline fluoride compound is lithium fluoride (LiF). The pre-selected thickness of the lithium fluoride layer is in a range from about 0.2 nm to about 5 nm to give Ohmic behavior. The electrically conductive material may be Al, Cr, Cu, Ag, Au, Ni, Fe, Ni, W, Mo, Co or alloys or mixtures of for example Mg:Ag and Li:Al. Preferably the electrically conductive material is aluminum (Al).

The layered structure 10 may be applied with a second surface of the layer comprising fullerenes opposed to the first surface physically contacted to a surface of a substrate for making electrical contact between the layered structure and the substrate. The substrate may be part of an optoelectronic device such as, but not limited to, light-emitting diodes, solar cells, photodetectors etc. The substrate may also be part of an electronic device such as field-effect transistors, tunneling diodes to mention just a few.

In another embodiment of a layered structure exhibiting Ohmic behavior included is a first layer comprising fullerenes, a second layer including a low work function material located on a first surface of the layer of fullerenes. The layered structure includes a third layer which is an electrically conductive material located on the second layer to which electrical contact can be made, the low work function material being selected so that the layered structure exhibits substantially Ohmic contact across the first, second and third layers.

The fullerene may be C60, C70 or combinations thereof. The layer comprising fullerenes may also include a mixture of fullerenes and organic molecules, a mixture of fullerenes and inorganic materials, polymeric fullerenes, and fullerenes chemically bonded to conducting polymers.

The electrically conductive material may be one of Al, Cr, Cu, Ag, Au, Ni, Fe, Ni, W, Mo, Co and alloys or mixtures of Mg:Ag or Li:Al to mention just a few. The layered structure 10 may be applied with a second surface of the fullerene layer (opposed to the first surface) physically contacted to a surface of a substrate for making electrical contact between the layered structure and the substrate. The substrate may be part of an optoelectronic device such as, but not limited to, light-emitting diodes, solar cells, photodetectors etc. The substrate may also be part of an electronic device such as field-effect transistors, tunneling diodes to mention just a few.

Figure 2:
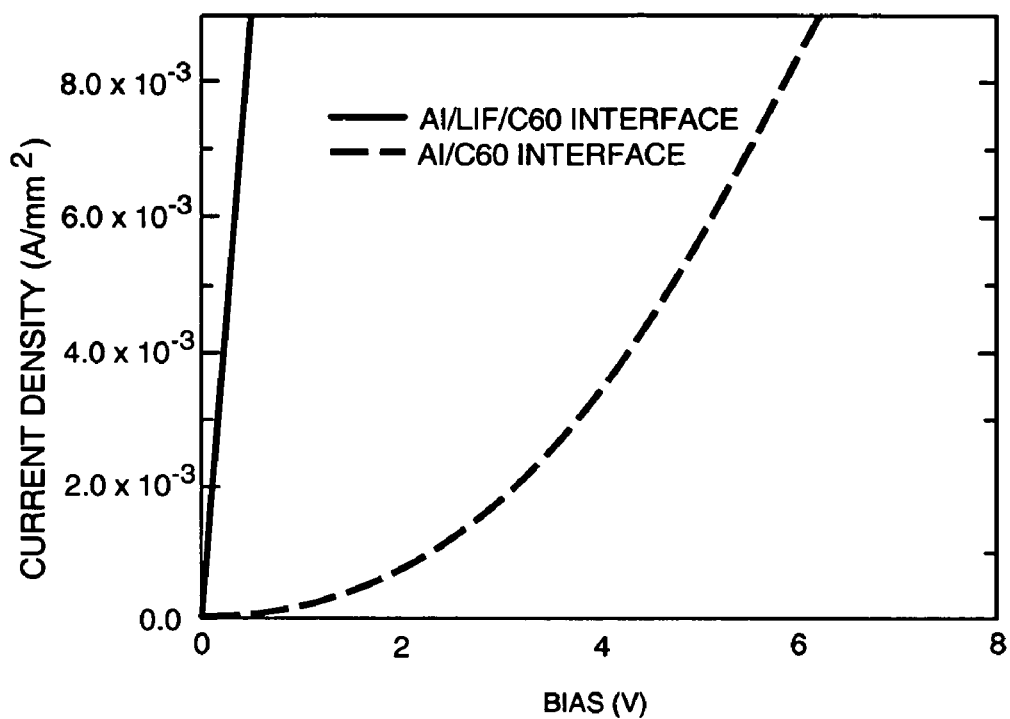
FIG. 2 is a plot of current versus voltage of a bi-layer interfacial structure, namely Al/LiF/C60 (solid line), and of a simple layered structure Al/C60 produced in accordance with the present invention.

FIG. 2 shows in graphic form a current-voltage relationship of 100 nm thick C60 fullerene sandwiched between two contacting electrodes with a stacking sequence, substrate/Al/C60/Al; and substrate/Al/LiF/C60/LiF/Al. A true interface Ohmic contact is characterized by no electron current barrier present across the interface. In the present test case, the current-voltage relationship should follow a linear relationship, where the slope of the linear line is determined by the resistivity of the layer. FIG. 2 shows that Al/C60 has strong rectifying characteristics; that Al/LiF/C60 shows excellent Ohmic contact characteristics.

Electroluminescent Device

Figure 3:
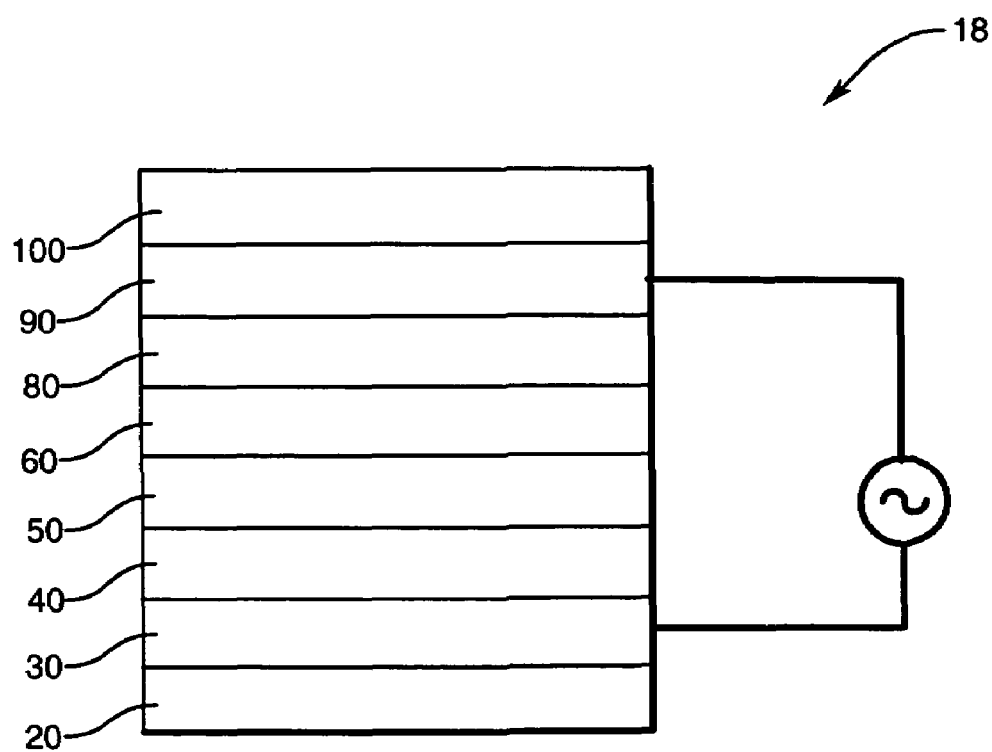
FIG. 3 is a schematic cross sectional view of a fullerene hybrid light-emitting device constructed in accordance with the present invention.

Referring to FIG. 3, an EL device 18 has been constructed to demonstrate the integration of a fullerene layer into a typical small organic molecule based device of the type disclosed in U.S. Pat. No. 4,356,429. The device 18 comprises a substrate 20, a conductive anode electrode layer 30 for hole injection, a hole transport layer 40 for hole transport, a light emissive or light-emission layer 50 capable of emitting light formed on the hole transport layer 40, a fullerene layer 60 formed on the light-emission layer 50, an outer conductive cathode layer 90 and an interfacial contact layer 80 sandwiched between fullerene layer 60 and cathode layer 90 which makes Ohmic contact with fullerene layer 60 and cathode layer 90. An optional cathode capping layer 100 made of a dielectric, such as Si oxides and nitrides, may be deposited on the cathode layer 90. The protective coating may also be a fullerene layer.

Substrate 20 may be a glass or alternatively it could be made of any material capable of providing mechanical support to thin films. It could be coated with functional thin-film transistors which may be used as electrical drivers. Substrate 20 may be optically transparent for light emitted from the light emissive layer. Alternatively, layers 80, 90 and 100 may be made of suitable materials and thickness to ensure light is coupled out of the light emissive layer 50 through these layers.

Conductive anode layer 30 is a hole injection electrode when a positive bias is applied and it may be, for example, of ITO. Electrode layer 30 may also be any other metal or alloy with a high work function. For example, anode layer 30 may be selected from high work function conducting materials including $SnO_2$, Ni, Pt, Au, p++ semiconductors (c-Si, a-Si, a-Si:H, poly-silicon). Additional anode materials are disclosed in U.S. Pat. No. 4,885,211 which is incorporated herein in its entirety.

Hole transport layer (HTL) 40 is preferably an organic-based layer and may be N-N'-diphenyl-N,N'-bis (3-methylphenyl) (1,1'-biphenyl) 4,4'-diamine (TPD) which is commonly used as the HTL, and may have a thickness of about, but not limited to, 60 nm. It could also be any other one or more layers of organic or polymer materials capable of transporting holes and having a thickness range from about 10 nm to about 300 nm. The hole-transport layer 40 may be comprised of those materials disclosed in United States Patent Publication No. 20020180349 which is Ser. No. 10/117,812 published Dec. 5, 2002 which is incorporated herein by reference in its entirety, which application refers to U.S. Pat. Nos. 4,539,507; 5,151,629; 5,150,006; 5,141,671 and 5,846, 666 which are all incorporated herein by reference in their entirety. This reference discloses different hole transport layer materials, electron transport layer materials, anode materials and cathode materials, which application refers to U.S. Pat. Nos. 4,539,507, 5,942,340 and 5,952,115 which are all incorporated herein by reference in their entirety.

Light emissive or light-emission layer 50 may be an organic electroluminescence layer comprised of, for example, tris-(8-hydroxyquinoline) aluminum (Alq) and may have a thickness of 25 nm. It could also be a layer of an organic compound capable of emitting different colors and having a thickness in the range from about 10 nm to about 100 nm. Other suitable materials useful for the light emission-layer include conjugated polymers such as poly (paraphenylene vinylene) (PPV); various members of PPV with and without pigment dyes such as disclosed in U.S. Pat. Nos. 5,294,869 and 5,151,629; rare earth metal, actinide or transition metal organic complex as disclosed in U.S. Pat. No. 6,524,727, all being incorporated herein by reference.

The active light-emission layer 50 region can also include any one or a mixture of two or more of fluorescent and phosphorescent materials including small molecules and polymers. For example, the active light-emission layer 50 may be comprised of those materials disclosed in United States Patent publication 20020180349. U.S. patent application Ser. Nos. 08/829,398; 09/489,144 and U.S. Pat. No. 6,057,048 also disclose materials which may be used for the light-emission layer and these references are incorporated herein in their entirety.

Electron transport layer 60 is preferably comprised of the fullerene compound C60 and has a thickness range from about 1 nm to about 300 nm, and more preferably from about 1 nm to 120 nm. The fullerene layer thickness may be selected to produce desired optical interference to generate multiple colors, colors of desired wavelength, and optimum optical power output.

Besides C60, the fullerene compound could be any other member of fullerenes such as C70, a mixture of two or more fullerene compounds such as C60:C70, a mixture of fullerenes with one or more organic molecules or polymers such as C60:Alq, C60:PPV. The electron transport layer 60 may include an organic molecule or polymer which are electron conductors mixed with the fullerenes. In addition, the electron transport layer may includes lithium fluoride (LiF) mixed with the fullerenes, or the electron transport layer may includes metal particles mixed with the fullerenes. Preferred metal particles are silver metal particles.

The interfacial layer 80 which makes contact with fullerene layer 60 is preferably made of a bi-layer of 2 nm LiF and Al. However, it will be appreciated by those skilled in the art that it could be any fluoride provided it is in direct contact with the fullerene layer. The interfacial layer 80 may be made using any low work function metals and alloys or mixtures such as Ca, Mg, Mg:Ag and Li:Al to mention just a few.

Cathode layer 90 is preferably aluminum (Al) and that which has a thickness of 100 nm has shown good behavior but other thickness may certainly be used. In addition, cathode 90 may be made of one or more layers of other well known conductive metals and/or alloys. For example, cathode 90 may be produced from one or more layers of highly conductive metals and alloys such as ITO, Al, Cr, Cu, Ag, Au, Ni, Fe, Ni, W, Mo, Co, Mg:Ag, Li:Al. An optional cathode capping layer 100 made of a dielectric, such as Si oxides and nitrides, may be deposited on the cathode by sputtering or any of the other coating techniques known to those skilled in the art.

Figure 4:
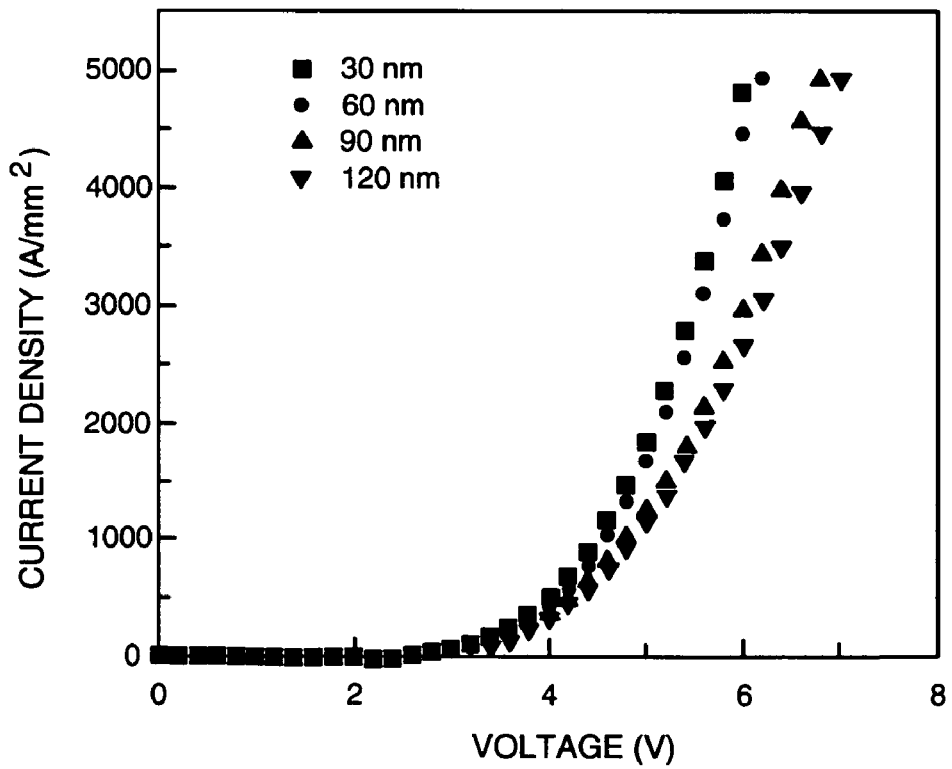
FIG. 4 is a plot of current versus voltage relationship for hybrid organic EL devices of FIG. 3 with four different thicknesses for the fullerene (C60) electron transport layer.
Figure 5:
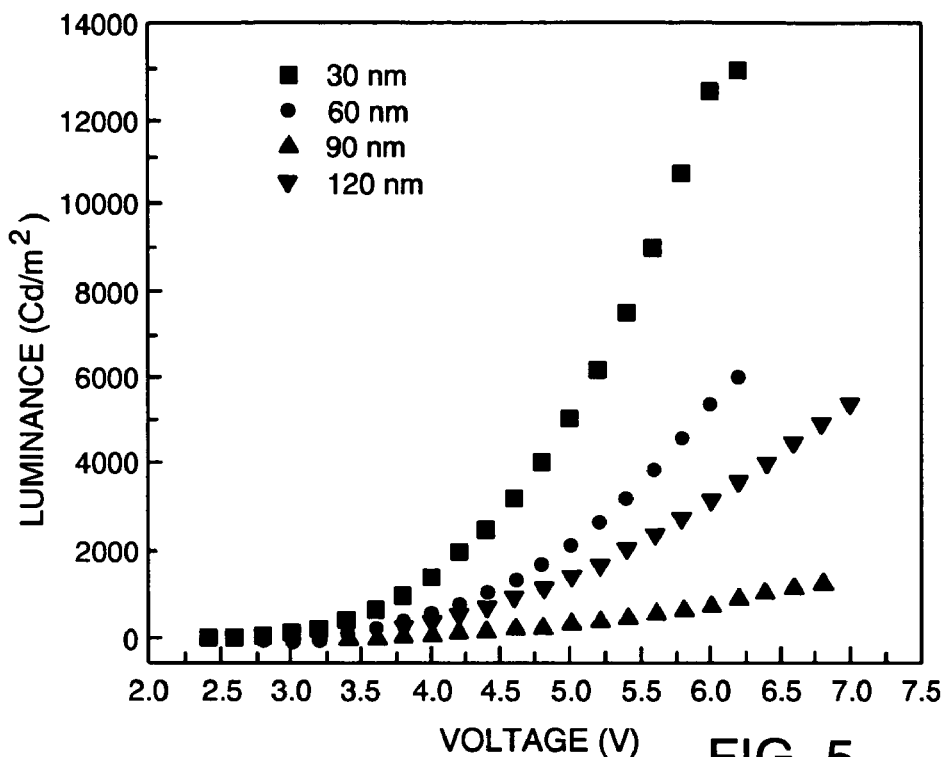
FIG. 5 shows plots of luminance versus voltage of hybrid organic EL devices of FIG. 3 with four different thicknesses for the fullerene (C60) electron transport layer with the four different curves corresponding to the four different thicknesses of the fullerene electron transport layer.
Figure 6:
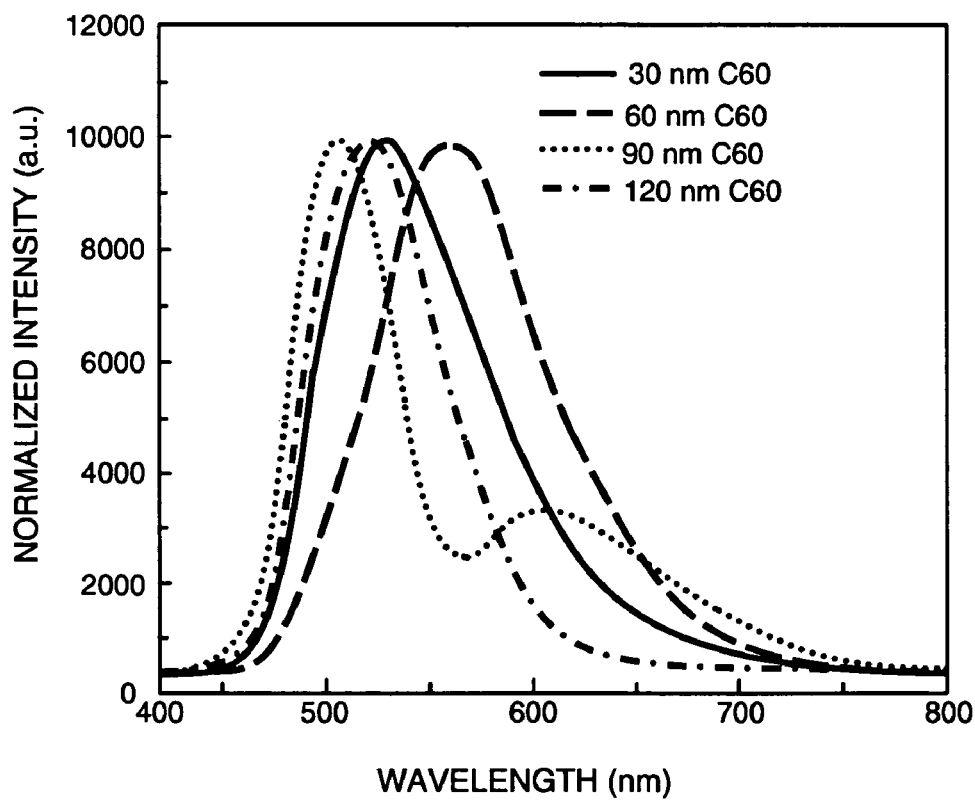
FIG. 6 shows the optical spectra of the hybrid organic EL devices of FIG. 3 with four different thicknesses for the fullerene (C60) electron transport layer.

The present invention provides a hybrid light-emitting device which uses a fullerene layer as a robust electron transport layer. The electrical properties of the fullerene layer, such as high electrical conductivity and excellent electrical contact with the cathode, has made possible to maintain similar current-voltage characteristics for a wide range of thickness, as is shown in FIG. 4. The difference in optical constant of the fullerene layers and light-emitting organics permits engineering of light out of the sandwich structure as is shown in FIG. 5, and engineering of light spectral distribution as is shown in FIG. 6.

Figure 7:
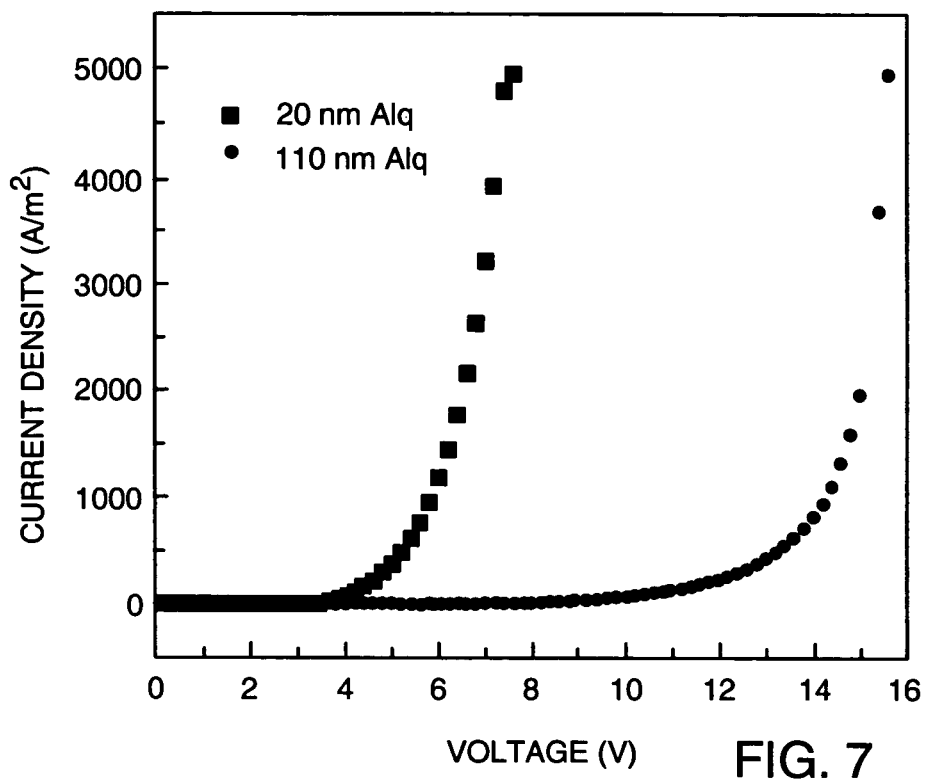
FIG. 7 shows two current-voltage characteristics of Prior Art organic EL devices having electron transport layers made from conventional tris-(8-hydroxyquinoline) aluminum (Alq) organics and a thickness of 20 nm and 110 nm.

To further demonstrate the advantage of the present light-emitting device 18 using fullerene layers over conventional pure organic based light-emitting devices, FIG. 7 shows the current-voltage characteristics of prior art devices made with a conventional electron transport layer 60 made of Alq. The thickness of the Alq electron transport layer is shown to alter the current-voltage characteristics, and to increase the driving voltage by several electron volts.

It will be appreciated by those skilled in the art that the fullerene layer may comprise a mixture of two or more fullerenes, e.g. C60:C70. The fullerene layer may also comprise carbon nano-tubes, and fullerenes deposited by vapor-phase deposition.

Figure 8:
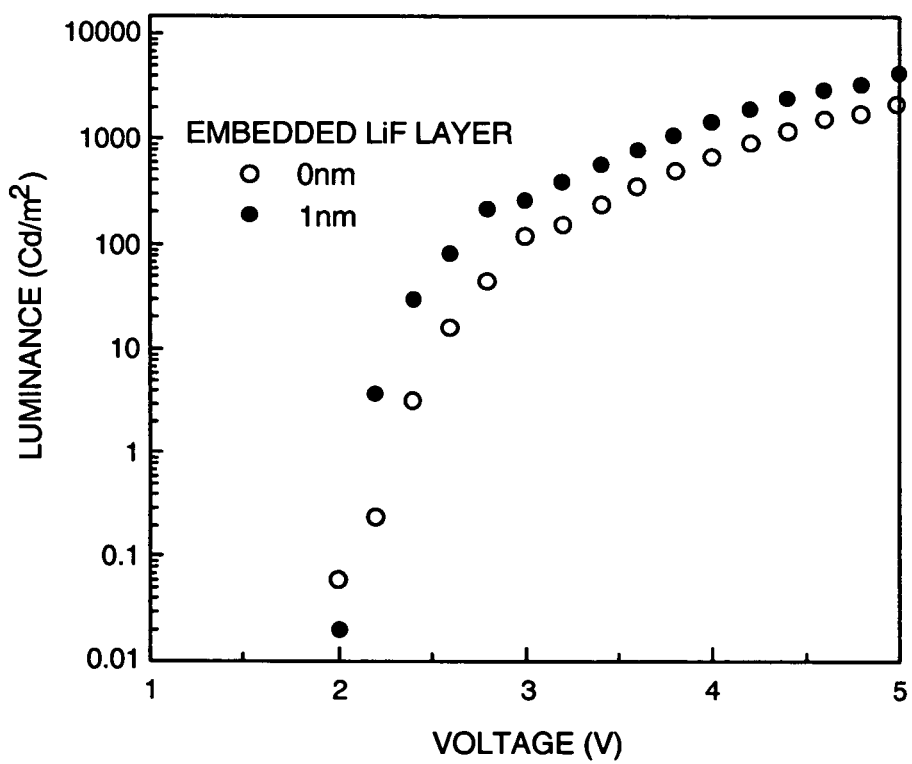
FIG. 8 compares luminance-voltage characteristics of two OLEDs with ( ), and without ( ) an embedded LiF layer, the test device structure is: glass substrate/ITO/TPD (50 nm)/Alq (25 nm)/[embeded LiF layer (0 nm ( ), 1 nm ( ))]/fullerene (25 nm)/LiF (0.5 nm)/Al (100 nm).

Referring again to FIG. 3 again, an alternative embodiment of the OLED display device includes inserting an interfacial layer (not shown) between fullerene layer 60 and light emissive layer 50. Based on studies by the inventors of devices which incorporate this interfacial layer, the latter provides further improvement in device performance. A thin lithium fluoride (LiF) layer of thickness (0.2-3 nm) is inserted which provides a better contact between layer 60 and layer 50 and results in a lower driving voltage for the device. FIG. 8 compares luminance-voltage characteristics of two OLEDs with ( ) and without ( ) embedded LiF layer. The test device structure is: glass substrate/ITO/TPD (50 nm)/Alq (25 nm)/[embedded LiF layer (0 nm ( ), 1 nm ( ))]/fullerene (25 nm)/LiF (0.5 nm)/Al (100 nm).

In another alternative embodiment of the OLED devices a layer of organic molecules with a lowest unoccupied molecular orbital (LUMO) energy of about 2 eV-3 eV and highest occupied molecular orbital (HOMO) energy of about 5-7 eV is inserted between layer 60 and layer 50. Such organic molecular layer will function as a hole blocking layer and would thus enhance exiton density in the EL layer 50 and consequently lead to a more efficient device. Non-limiting examples of such molecules include 4,4'-bis(carbazol-9-yl)-biphenyl; 2,9-dimethyl-4,7-diphenyl-1,10-phenanthroline; 1,3-Bis(5-(4-diphenylamino)phenyl-1,3,4-oxadiazol-2-yl) benzene; 3,4,5-Triphenyl-1,2,4-triazole; 3-(Biphenyl-4-yl)-4-phenyl-5-tert-butylphenyl-1,2,4-triazole; 3,5-Bis(4-tert-butylphenyl)-4-phenyl-[1,2,4]triazole; 2-(4-Biphenylyl)-5-(4-tert-butylphenyl)-1,3,4-oxadiazole; 1,3-Bis[5-(4-(1,1-dimethylethyl)phenyl)-1,3,4-oxadiazol-2-yl]benzene; 1,4-Bis(5-(4-diphenylamino)phenyl-1,3,4-oxadiazol-2-yl) benzene; 1,3,5-Tris[5-(4-(1,1-dimethylethyl)phenyl)-1,3,4-oxadiazol-2-yl]benzene.

As used herein, the terms "comprises", "comprising", "including" and "includes" are to be construed as being inclusive and open ended, and not exclusive. Specifically, when used in this specification including claims, the terms "comprises", "comprising", "including" and "includes" and variations thereof mean the specified features, steps or components are included. These terms are not to be interpreted to exclude the presence of other features, steps or components.

The foregoing description of the preferred embodiments of the invention has been presented to illustrate the principles of the invention and not to limit the invention to the particular embodiment illustrated. It is intended that the scope of the Therefore what is claimed is:

1. A light emitting device, comprising:
   a) a substrate;
   b) a first electrically conductive layer forming an anode electrode layer on the substrate;
   c) a hole transport layer on said anode electrode layer;
   d) a layer of a light emissive material on said hole transport layer;
   e) an electron transport layer comprising fullerenes located on said layer of a light emissive material;
   f) a first interfacial layer located between said layer of light emissive material and said electron transport material, said first interfacial layer comprising organic molecules with a LUMO energy level of about 2 eV to about 3 eV and HOMO energy of about 5 eV to about 7eV located on said layer of light emissive material;
   g) a second electrically conductive layer forming a cathode electrode layer located on said electron transport layer; and
   h) a second interfacial layer located between said electron transport layer and said second electrically conductive layer, said interfacial layer comprising a fluoride compound for providing an Ohmic contact between said cathode electrode layer and said fullerene layer,
   wherein the organic molecules in said first interfacial layer are selected from the group consisting of 4,4'-bis(carbazol-9-yl) biphenyl; 2,9-dimethyl-4,7-diphenyl-1,10-phenanthroline; 1,3-Bis(5-(4-diphenylamino) phenyl-1,3,4-oxadiazol-2-yl)benzene; 3,4,5-Triphenyl-1,2,4-triazole; 3(Biphenyl-4-yl)-4-phenyl-5-tert-butylphenyl-1,2,4-triazole; 3,5-Bis (4-tert-butylphenyl)-4-phenyl-[1,2,4]triazole; 2-(4-Biphenylyl)-5-(4-tert-butylpheflyl)-1,3,4-oxadiazole; 1,3-Bis[5- (4-(1,1-dimethylethyl)phenyl)-1,3,4-oxadiazol-2-yl]benzene; 1,4-Bis(5-(4-diphenylamino)phenyl-1,3,4-oxadiazol-2-yl)benzene; and 1,3.5-Tris[5-(4-(1,1-dimethylethyl) phenyl)-1,3,4-oxadiazol-2-yl]benzene.

2. The light emitting device of claim 1, wherein said hole transport layer is comprised of organic molecules which conduct holes.

3. The light emitting device of claim 1, wherein said hole transport layer has a thickness in a range from about 1 nm to about 300 nm.

4. The light emitting device according to claim 1, wherein said second electrically conductive layer forming a cathode electrode layer is selected from the group consisting of Al, Cr, Cu, Ag, Au, Ni, Fe, Ni, W, Mo, Co and alloys or metal mixtures.

5. The light emitting device of claim 4, wherein said alloy or mixture is a Mg:Ag or Li:Al alloy or mixture.

6. The light emitting device of claim 1, wherein said second interfacial layer comprising a fluoride compound has a thickness in a range from about 0.2 nm to about 10 nm.

7. The light emitting device of claim 1, wherein said fluoride compound is an alkaline fluoride compound.

8. The light emitting device of claim 7, wherein said alkaline fluoride compound is lithium fluoride (LiF).

9. The light emitting device of claim 1, wherein said fluoride compound is calcium fluoride ($CaF_2$).

10. The light emitting device of claim 1, wherein said second electrically conductive layer forming a cathode electrode layer is aluminum (Al).

11. The light emitting device of claim 1, wherein said fullerenes are selected from the group consisting of C60, C70 and combinations thereof.

12. The light emitting device of claim 1, wherein said electron transport layer includes an organic molecule or polymer which are electron conductors mixed with said fullerenes.

13. The light emitting device of claim 12, wherein said organic molecule is tris-(8-hydroxyquinoline) aluminum (Alq), and wherein said fullerenes are selected from the group consisting of C60, C70 and combinations thereof.

14. The light emitting device of claim 1, wherein said electron transport layer includes lithium fluoride (LiF) mixed with said fullerenes.

15. The light emitting device of claim 1, wherein said electron transport layer includes metal particles mixed with said fullerenes.

16. The light emitting device of claim 15, wherein said metal particles are silver metal particles.

17. The light emitting device of claim 1, wherein said electron transport layer has a thickness in a range from about 1 nm to about 300 nm.

18. The light emitting device of claim 1, wherein the first electrically conductive layer forming an anode electrode layer on the substrate is a high work function material.

19. The light emitting device of claim 18, wherein the high work function material is selected from the group consisting of ITO, $SnO_2$, Ni, Pt, Au, p++semiconductors including c-Si, a-Si, a-Si:H, and poly silicon.

20. The light emitting device of claim 1, including a protective coating deposited on a top surface of the electrically conductive layer forming the cathode electrode.

21. The light emitting device of claim 20, wherein said protective coating is selected from the group consisting of dielectrics including oxides of Si and nitrides.

22. The light emitting device of claim 20, wherein said protective coating is a fullerene layer.

23. The light emitting device of claim 1, including a power supply for applying a voltage across the anode electrode layer and the cathode electrode layer.

24. The light emitting device of claim 1, including an interfacial layer interposed between the electron transport layer and said electrically conductive layer forming a cathode electrode, said interfacial layer comprising a fluoride compound.

25. The light emitting device of claim 1, including an interfacial layer interposed between the electron transport layer and said electrically conductive layer forming a cathode electrode, said interfacial layer comprising a low work function metal or alloy.

26. The light emitting device of claim 25, wherein said low work function metal or alloy is selected from the group consisting of calcium (Ca), magnesium (Mg), and alloys of Mg:Ag and Li:Al.

27. The light emitting device of claim 25, wherein said second electrically conductive layer forming a cathode electrode layer is aluminum.

* * * * *